(12) United States Patent
Sun

(10) Patent No.: US 11,646,916 B2
(45) Date of Patent: May 9, 2023

(54) RECEIVER WITH THRESHOLD LEVEL FINDER

(71) Applicant: CREDO TECHNOLOGY GROUP LTD, Grand Cayman (KY)

(72) Inventor: Junqing (Phil) Sun, San Jose, CA (US)

(73) Assignee: CREDO TECHNOLOGY GROUP LTD, Grand Cayman (KY)

(*) Notice: Subject to any disclaimer, the term of this patent is extended or adjusted under 35 U.S.C. 154(b) by 69 days.

(21) Appl. No.: 17/301,782

(22) Filed: Apr. 14, 2021

(65) Prior Publication Data
US 2021/0242861 A1 Aug. 5, 2021

Related U.S. Application Data

(62) Division of application No. 16/691,523, filed on Nov. 21, 2019, now Pat. No. 11,018,656.

(51) Int. Cl.
*H04L 25/03* (2006.01)
*H04B 10/69* (2013.01)
(Continued)

(52) U.S. Cl.
CPC ....... *H04L 25/03057* (2013.01); *H03K 5/082* (2013.01); *H04B 3/04* (2013.01); *H04B 10/6971* (2013.01); *H04B 14/023* (2013.01); *H04B 14/026* (2013.01); *H04L 25/0214* (2013.01); *H04L 27/01* (2013.01)

(58) Field of Classification Search
CPC ........... H04L 25/03057; H04L 25/0214; H04L 27/01; H04L 27/02; H04L 25/0202; H04L 25/4917; H04L 25/03267; H04L 25/03312; H04L 25/061; H03K 5/082; H04B 3/04;
(Continued)

(56) References Cited

U.S. PATENT DOCUMENTS 5,521,941 A * 5/1996 Wiatrowski .......... H04L 25/066
 307/73
7,298,772 B1 11/2007 Neerudu et al.
(Continued)

FOREIGN PATENT DOCUMENTS

GB 2435569 A * 8/2007 ....... H04L 25/03057
WO WO-2004107325 A2 * 12/2004 ....... G11B 20/10212

*Primary Examiner* — Jean B Corrielus
(74) *Attorney, Agent, or Firm* — Ramey LLP; Daniel J. Krueger

(57) ABSTRACT

An illustrative receiver includes: a decision element that derives symbol decisions from a slicer input signal; an equalizer that converts a receive signal into the slicer input signal; a summer that combines the symbol decisions with the slicer input signal to produce an error signal; and a level finder that operates on said signals to determine thresholds at which each signal has a given probability of exceeding the threshold. One illustrative level finder circuit includes: a gated comparator and an asymmetric accumulator. The gated comparator asserts a first or a second gated output signal to indicate when an input signal exceeds or falls below a threshold with a programmable condition being met. The asymmetric accumulator adapts the threshold using up steps for assertions of the first gated output signal and down steps for assertions of the second gated output signal, with the up-step size being different than the down-step size.

20 Claims, 6 Drawing Sheets

(51) Int. Cl.
*H04L 27/01* (2006.01)
*H04B 14/02* (2006.01)
*H04L 25/02* (2006.01)
*H04B 3/04* (2006.01)
*H03K 5/08* (2006.01)

(58) Field of Classification Search
CPC ............. H04B 10/6971; H04B 14/023; H04B 14/026; H04B 10/695
See application file for complete search history.

(56) References Cited

U.S. PATENT DOCUMENTS

| | | |
|---|---|---|
| 7,353,245 B2 | 4/2008 | Healey et al. |
| 8,301,036 B2 | 10/2012 | He |
| 9,071,479 B2 | 6/2015 | Qian et al. |
| 9,935,800 B1 | 4/2018 | He |
| 10,181,941 B1 | 1/2019 | Chen et al. |
| 10,547,475 B1 | 1/2020 | Gagnon |
| 2004/0044713 A1 | 3/2004 | Healey et al. |
| 2004/0203559 A1 | 10/2004 | Stojanovic et al. |
| 2006/0256892 A1 | 11/2006 | Momtaz |
| 2009/0252347 A1* | 10/2009 | Kakkeri ............... H03G 3/3026 381/107 |
| 2012/0106607 A1 | 5/2012 | Miladinovic et al. |
| 2014/0269956 A1 | 9/2014 | Chang et al. |

* cited by examiner

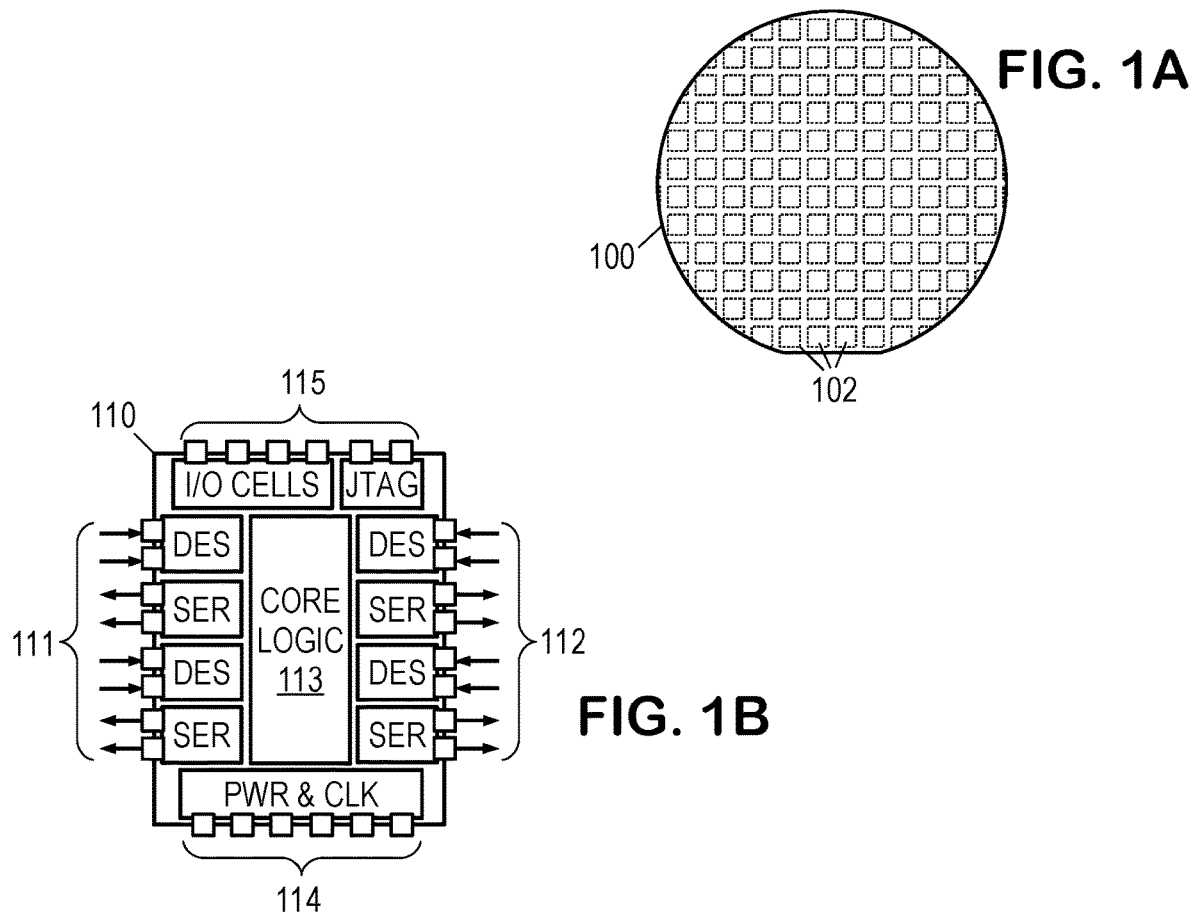
FIG. 1A
FIG. 1B
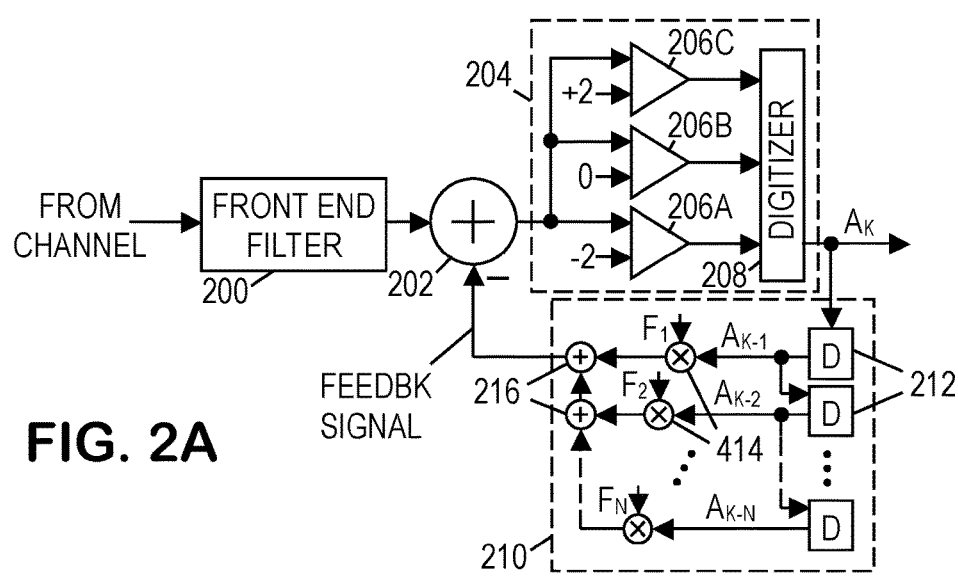
FIG. 2A

RECEIVER WITH THRESHOLD LEVEL FINDER

CROSS-REFERENCE TO RELATED APPLICATIONS

The present application is a divisional of U.S. application Ser. No. 16/691,523, filed 2019 Nov. 21, now U.S. Pat. No. 11,018,656, and titled "Multi-function level finder for SerDes" by inventor J. Sun, which is hereby incorporated herein by reference in its entirety.

BACKGROUND

Digital communications occur between sending and receiving devices over an intermediate communications medium, or "channel" (e.g., a fiber optic cable or insulated copper wires). Each sending device typically transmits symbols at a fixed symbol rate, while each receiving device detects a (potentially corrupted) sequence of symbols and attempts to reconstruct the transmitted data. A "symbol" is a state or significant condition of the channel that persists for a fixed period of time, called a "symbol interval." A symbol may be, for example, an electrical voltage or current level, an optical power level, a phase value, or a particular frequency or wavelength. A change from one channel state to another is called a symbol transition. Each symbol may represent (i.e., encode) one or more binary bits of the data. Alternatively, the data may be represented by symbol transitions, or by a sequence of two or more symbols.

Many digital communication links use only one bit per symbol; a binary '0' is represented by one symbol (e.g., an electrical voltage or current signal within a first range), and binary '1' by another symbol (e.g., an electrical voltage or current signal within a second range), but higher-order signal constellations are known and frequently used. In 4-level pulse amplitude modulation (PAM4), each symbol interval may carry any one of four symbols, denoted as −3, −1, +1, and +3. Two binary bits can thus be represented by each symbol.

Channel non-idealities produce dispersion which may cause each symbol to perturb its neighboring symbols, a consequence known as inter-symbol interference (ISO. ISI can make it difficult for the receiving device to determine which symbols were sent in each interval, particularly when such ISI is combined with additive noise.

To combat noise and ISI, receiving devices may employ various equalization techniques. Linear equalizers generally have to balance between reducing ISI and avoiding noise amplification. Decision Feedback Equalizers (DFE) are often preferred for their ability to combat ISI without inherently amplifying the noise. As the name suggests, a DFE employs a feedback path to remove ISI effects derived from previously-decided symbols. Other potentially suitable equalization and demodulation techniques are available in the relevant academic literature, including, e.g., peak detectors and partial response equalization. Most such techniques employ some form of channel characterization or receiver adaptation to enhance performance and suitability for use in challenging conditions. While desirable, the implementations of such features must strike a balance between complexity (areal and power requirements) and benefit. Many such implementations exist, yet there remains significant room for improvement.

SUMMARY

Accordingly, there is provided herein a level finder having a relatively low complexity while enabling multiple desirable channel characterization and adaptation functions. An illustrative receiver embodiment includes: a decision element that derives symbol decisions from a slicer input signal; an equalizer that converts a receive signal into the slicer input signal; a summer that combines the symbol decisions with the slicer input signal to produce an error signal; and a level finder that operates on at least one of said receive signal, said slicer input signal, and said error signal, to determine a threshold at which said at least one signal has a given probability of exceeding the threshold.

One illustrative level finder circuit embodiment includes: a gated comparator and an asymmetric accumulator. The gated comparator asserts a first gated output signal only when an input signal exceeds a threshold with a programmable condition being met and asserts a second gated output signal only when the input signal falls below the threshold with the programmable condition being met. The asymmetric accumulator adapts the threshold using up steps for assertions of the first gated output signal and down steps for assertions of the second gated output signal, with the up-step size being different than the down-step size.

One illustrative level finder method includes: asserting a first gated output signal only when an input signal exceeds a threshold with a programmable condition being met; asserting a second gated output signal only when the input signal falls below the threshold with the programmable condition being met; and adapting the threshold using up steps for assertions of the first gated output signal and down steps for assertions of the second gated output signal, with the up-step size being different than the down-step size.

Each of the foregoing embodiments may be implemented individually or conjointly, together with any one or more of the following optional features in any suitable combination: 1. each of the decision element, the equalizer, the summer, and a gated comparator component of the level finder, are parallelized to provide concurrent processing paths. 2. the probability is subject to a programmable condition being met. 3. the programmable condition includes one or more conditions in the list consisting of: a symbol decision having a given value at a selected offset from a current symbol interval, a symbol decision not having the given value at the selected offset from the current symbol interval, a current symbol having a first specified value, a preceding symbol having a second specified value, and assertion of one or more matching criterion bypass signals. 4. the level finder is a dual level finder. 5. the gated comparator compares the input signal to multiple thresholds and conditionally asserts for each threshold one of two corresponding gated output signals indicating whether the input signal exceeds or falls below that threshold with a corresponding programmable condition being met. 6. the gated comparator is one of multiple gated comparators operating in parallel on a parallel set of input signals to assert a respective first gated output signal in a parallel set of first gated output signals only when the respective input signal exceeds the threshold with the programmable condition being met and to assert a respective second gated output signal in a parallel set of second gated output signals only when the respective input signal falls below the threshold with the programmable condition being met. 7. a first summer that sums the parallel set of first gated output signals to provide the asymmetric accumulator with a combined first gated output signal; and a second summer that sums the parallel set of second gated output signals to provide the asymmetric accumulator with a combined second gated output signal. 8. the gated comparator comprises matching logic for verifying the programmable condition. 9. a shift register that provides at least the current symbol and the preceding symbol to the gated comparator. 10. an input multiplexer that provides, as said input signal, a selectable one of: a receive signal, a slicer input signal, and an error signal, said receive, slicer input, and error signal being provided by an equalizer of a communications receiver. 11. the equalizer is a decision feedback equalizer having at least one precomputation unit. 12. comparing the input signal to multiple thresholds and conditionally asserting for each threshold one of a corresponding pair of gated output signals in said set to indicate whether the input signal exceeds or falls below that threshold with a corresponding programmable condition being met.

BRIEF DESCRIPTION OF THE DRAWINGS

FIG. 1A is a plan view of a wafer patterned with integrated circuit devices.

FIG. 1B is a block diagram of an illustrative application-specific integrated circuit.

FIG. 2A shows an illustrative decision feedback equalizer (DFE) implementation.

DETAILED DESCRIPTION

Figure 2B:
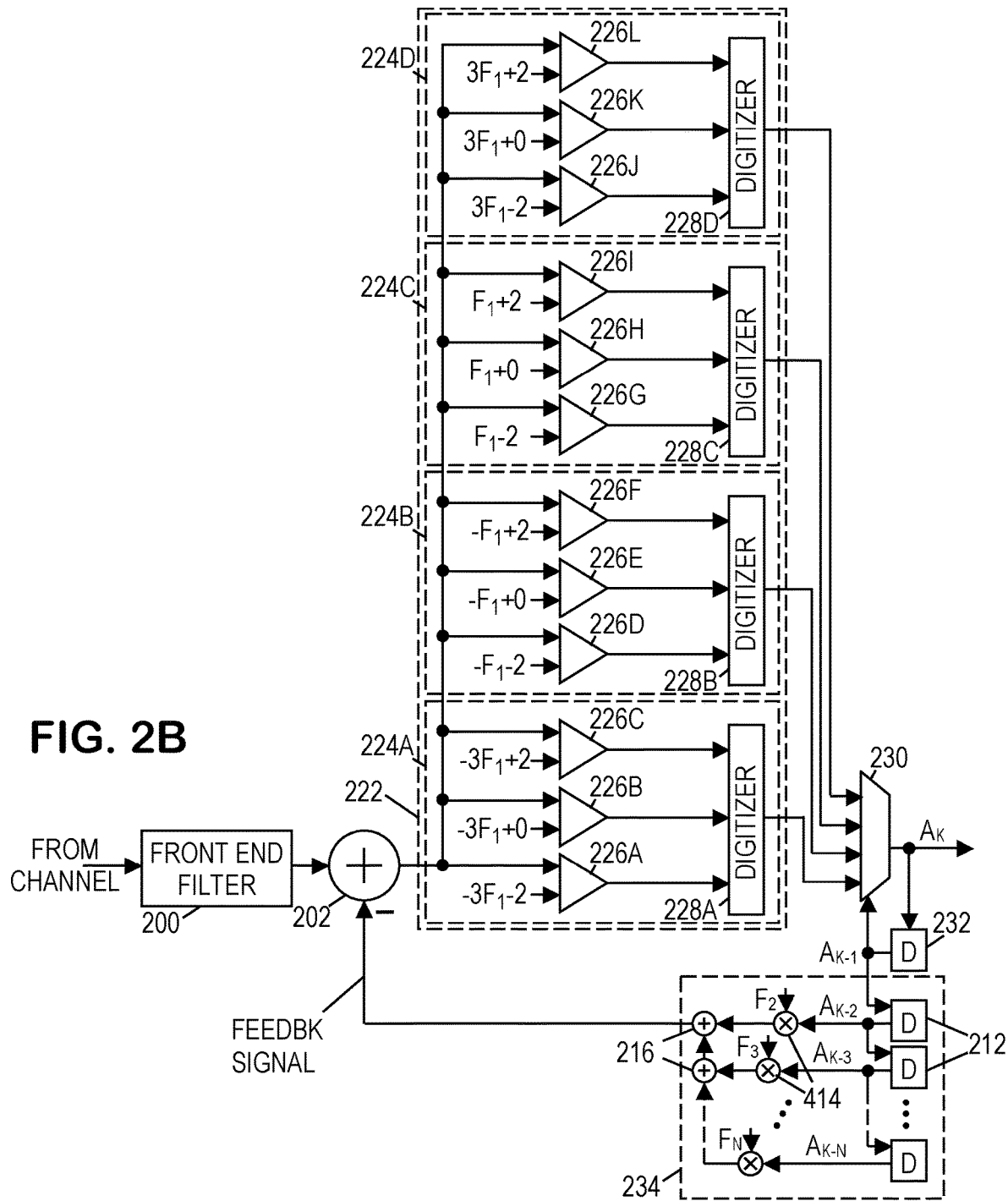
FIG. 2B shows an illustrative DFE employing a one-tap precomputation unit.

While specific embodiments are given in the drawings and the following description, keep in mind that they do not limit the disclosure. On the contrary, they provide the foundation for one of ordinary skill to discern the alternative forms, equivalents, and modifications that are encompassed in the scope of the appended claims.

FIG. 1A shows a plan view of a semiconductor wafer 100, patterned to form an array of integrated circuits 102 which can be diced apart into IC chips and packaged as modular components for assembly into electronic devices. The IC chips can be packaged individually or combined into multi-chip modules using an interposer and/or package substrate, in either case employing a ball grid array or wire lead frame to provide external contacts for electrically connecting to other circuit components, usually via a printed circuit board. Each IC chip can implement digital logic, analog functionality, and/or mixed signal circuitry.

The patterning of wafers is performed by a semiconductor fabrication plant ("fab") applying a series of cleaning, alignment, deposition, patterning, etching, implantation, and related processes. The "recipe" (the sequence of patterns and process steps) employed determines the functionality of the resulting integrated circuits. Electronic device designers working for the fab's customers, or for the company that owns the fab, specify the recipe to be used. As described in the background, the designers facilitate the design process by relying on modular layout design units to implement desired elements of the integrated circuit. These modular units may be predefined units obtained from an existing library or from vendors that specialize in designing the desired type of element.

FIG. 1B shows an illustrative high-speed serializer/deserializer ("SerDes") retimer chip 110, which serves here as an example of an integrated circuit device. Chip 110 includes SerDes modules with contacts 111 for receiving and transmitting high-rate serial bitstreams across four lanes in one direction, additional SerDes modules with contacts 112 for receiving and transmitting the high-rate serial bitstreams across four lanes in another direction, and core logic 113 for implementing a channel communications protocol while buffering bitstreams between the two directions. Also included are various supporting modules and contacts 114, 115, such as power regulation and distribution, clock generation, digital input/output lines for control, and a JTAG module for built-in self testing. The chip designer can design the device by placing the predefined modular units for the serializers, deserializers, power, clock generator, I/O cells, and JTAG; and routing the interconnections between the modular units with a bit of supporting logic.

The "deserializer" implements the receiving function of the chip 110, implementing any suitable equalization technique, e.g., peak detection, linear equalization, partial response equalization, and decision feedback equalization (DFE). In many cases, DFE is preferred and will be used here to provide context for explaining operation of the multi-function level finder disclosed herein. Regardless, the reader will recognize the suitability of the disclosed level finder for use with other equalizers or, more generally, for use with other receivers of wired or wireless digital signals.

FIG. 2A shows an illustrative implementation of a DFE. An analog or digital front end filter 200 operates on the receive signal to shape the overall channel response of the system and minimize the effects of leading ISI on the current symbol. As part of the shaping of the overall channel response, the front end filter 200 may alternatively be designed to shorten the channel response of the filtered signal while minimizing any attendant noise enhancement. A summer 202 subtracts a feedback signal from the output of the front end filter 200 to minimize the effects of trailing ISI on the current symbol.

A decision element 204 employs a set of comparators 206 to digitize the combined signal and produce a stream of output data (denoted Ak, where k is the time index). In the illustrated example, the symbols are presumed to be PAM4 (−3, −1, +1, +3), so comparators 206A-206C accordingly employ the decision thresholds −2, 0, and +2, respectively. (The unit for expressing symbol and threshold values is omitted for generality, but for explanatory purposes may be presumed to be volts.) The comparator outputs can be taken collectively as a thermometer-coded digital representation of the output symbol decision, e.g., with 000 representing −3, 100 representing −1, 110 representing+1, and 111 representing+3. Textbook-style embodiments employ an optional digitizer 208 to convert the comparator outputs into a binary number representation, e.g., 00 to represent −3, 01 to represent −1, 10 to represent +1, and 11 to represent +3. Alternatively, a Gray-coded representation could be employed. Here, the digitizer 208 is used merely to represent the collecting of comparator outputs into a unified digital representation.

The DFE generates the feedback signal with a feedback filter 210 having a series of delay elements 212 (e.g., latches, flip flops, or registers) that store the recent output symbol decisions ($A_{k-1}, A_{k-2}, \ldots, A_{k-N}$, where N is the number of filter coefficients Fi). A set of multipliers 214 determines the product of each symbol with a corresponding filter coefficient, and a series of summers 216 combines the products to obtain the feedback signal.

As an aside, we note here that the circuitry for the front end filter 200 and the feedback filter 210 can operate on analog signals, or conversely, it can be implemented using digital circuit elements and/or software in a programmable processor. Further, a timing recovery unit and a filter coefficient adaptation unit augment the operation of the DFE, but such considerations are addressed in the literature and generally known to those skilled in the art. Nevertheless we note here that at least some contemplated embodiments include one or more additional comparators to be employed for comparing the combined signal to one or more of the extreme symbol values (−3, +3), thereby providing an error signal that can be used for timing recovery with, e.g., a "bang-bang" design. We further note that the adaptation unit may employ the error signal to adapt the coefficients of both the front end filter 200 and the feedback filter 210 during a training phase when a known symbol sequence is employed.

In the embodiment of FIG. 2A, the feedback filter 210 must complete its operation in less than one symbol interval because its output depends in part upon the immediately preceding decision. At very high data rates, one symbol interval does not provide sufficient time to finish the filter multiplications and the feedback subtraction. Accordingly, one solution that has been proposed in the literature is "unrolling" the feedback filter.

FIG. 2B shows an illustrative variation of FIG. 2A that unrolls the feedback filter by one tap. The embodiment of FIG. 2B employs the same front end filter 200, but summer 202 subtracts a feedback signal to remove the trailing ISI caused by all but the immediately preceding symbol. For each possible value of the immediately preceding symbol, the precomputation unit 222 provides a decision element 224A-224D. Decision element 224A speculatively assumes that the preceding symbol was −3, and rather than subtracting the ISI that would result from this symbol (−3*$F_1$, where $F_1$ is the coefficient of the first tap in the textbook feedback filter 210), the thresholds of comparators 226A-226C have been adjusted relative to the thresholds of comparators 206A-206C by adding −3*$F_1$, enabling decision element 224A to form a tentative symbol decision based on this speculative assumption.

Similarly, decision elements 2248, 224C, and 224D employ comparators with suitably adjusted thresholds to render tentative decisions under the speculative assumptions that the preceding symbol was −1, +1, and +3, respectively. The precomputation unit 222 supplies these tentative decisions to a multiplexer 230, which selects the proper tentative decision based on the immediately preceding symbol decision $A_{k-1}$, which is stored by delay element 232. Feedback filter 234 has a reduced number of taps (filter coefficients), but otherwise operates similarly to feedback filter 210.

Although this unrolling step increases the number of elements in the DFE loop (i.e., in the loop including summer 202, precomputation unit 222, multiplexer 230, delay element 232, and feedback filter 234), only the elements of the inner loop (i.e., the loop including multiplexer 230 and delay element 232) need to achieve their operations in less than one symbol interval. The remaining DFE loop elements can take up to two symbol intervals to complete their pipelined operation. If it is still a challenge to complete the feedback filter operation in time, further unrolling can be performed.

Figure 3:
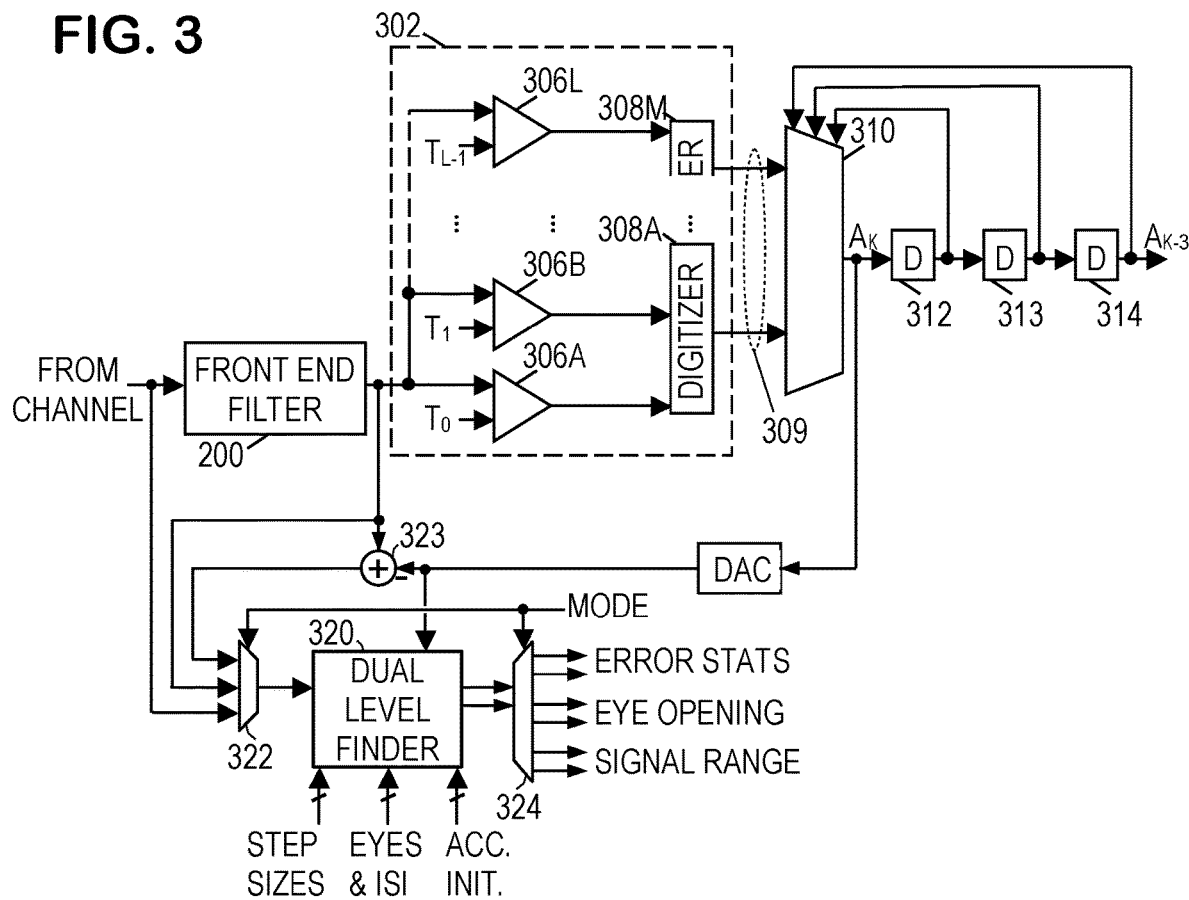
FIG. 3 shows an illustrative DFE with a fully-unrolled precomputation unit.

The disclosed principles may be extended as shown in FIG. 3, which shows an illustrative variation in which a 3-tap feedback filter has been completely unrolled. This embodiment still employs front end filter 200, but the summer 202 is eliminated since the feedback filter has been completely unrolled. Its function has been fully supplanted by precomputation unit 302, which provides a separate decision element for each combination of the three preceding symbols. The digitizers 308A-308M supply the tentative decisions 309 to a large multiplexer 310, which selects one tentative decision from the set based on the three preceding symbol decisions held in delay elements 312, 313, 314, thereby producing the sequence of symbol decisions Ak.

Where the cardinality of the symbol set is P and the number of feedback filter coefficients is N, the number of decision elements in the precomputation unit 302 is $M=P^N$. Thus, for a PAM4 system (i.e., P=4) with a 3-tap feedback filter, the number of decision elements would be $4^3=64$. As each decision element employs P−1 comparators, the precomputation unit employs $L=(P-1)P^N$ comparators, or 192 comparators for the 3-tap PAM4 DFE example. Thus with each increase in the length of trailing ISI and each increase in symbol set cardinality, the size of the precomputation unit grows exponentially, as does the size of the multiplexer 310.

The DFE of FIG. 3 is augmented with a multi-function level finder. The illustrated multi-function level finder is a dual level finder 320 with an input multiplexer ("mux") 322 and an output de-multiplexer ("demux") 324. Based on a mode selection signal, the input mux 322 selects one of multiple signals from different stages of the equalizer. In FIG. 3, the signals are the receive signal, the slicer input signal, and an error signal. While the signals can be digital or analog, they are assumed to be analog in the present example. Thus the receive signal is the output of a buffer or amplifier at the receiver's input, the slicer input signal is the receive signal as modified by the front-end filter 200 (and by the output of the feedback filter, if present), and the error signal is the difference between the slicer input signal and the corresponding output symbol decision (in analog form). The summer 323 may include an appropriate delay for the slicer input signal to ensure that the error is determined correctly.

As will become clear, the level finder is an adaptive controller that employs asymmetric step sizes to find a threshold at which the selected signal's cumulative probability distribution function (CDF) reaches a given value. A dual level finder enables two such thresholds to be determined concurrently. The dual level finder 320 operates on the selected signal using the input parameters (step sizes, eye edge and/or ISI selections, accumulator initializations, and symbol decisions) to measure the correspondingly conditioned signal levels (as described further below). Among other things, the dual level finder output may represent the receive signal range, the size of a selected eye opening, or an error distribution measure.

To determine the receive signal range, the mode select signal causes the mux 322 to forward the receive signal to the dual level finder 320. The dual level finder is programmed to find a first threshold at which the signal CDF is, say, 1/1024 (meaning that the receive signal exhibits only about 0.098% chance of falling below that threshold) and a second threshold at which the signal CDF is, say, 1023/1024 (meaning that the signal only exceeds that threshold only about 0.098% of the time). These two thresholds then represent the signal range within which the signal can be found 99.8% of the time. The thresholds are forwarded to an appropriate register by demux 324, and may be used by a controller for the receivers (the controller may be integrated into the core logic 113) to perform adaptive gain control, enabling optimal use of the dynamic range of the front end filter 200 (or of the optional analog-to-digital converter).

To characterize the probability distribution function of the error signal, the mode select signal causes the mux 322 to forward the error signal to the dual level finder 320. The level finder can be set to determine thresholds at each of multiple CDF values, e.g., $2^{-2}$, $2^{-4}$, $2^{-6}$, $2^{-8}$, $2^{-10}$, $2^{-12}$, enabling the CDF and/or the probability distribution function to be measured and extrapolated. The controller may employ these measurements alone or in combination with the eye opening measurements to calculate estimated symbol error rates or bit error rates.

Figure 4A:
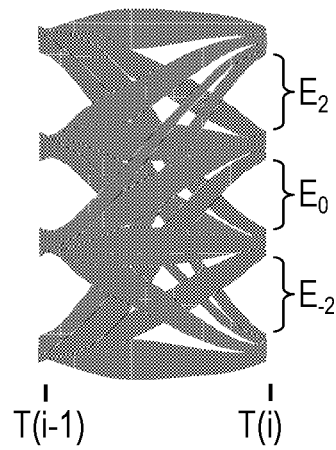
FIGS. 4A-4E show illustrative eye diagrams with and without accounting for previous symbol decisions.
Figure 4B:
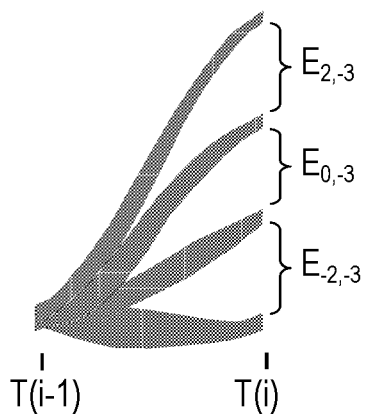
Figure 4C:
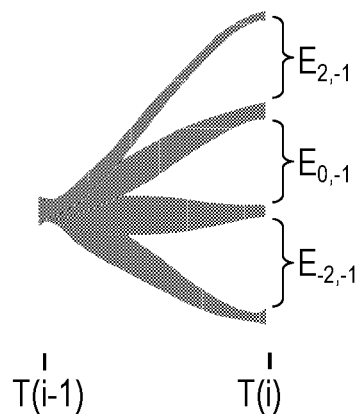
Figure 4D:
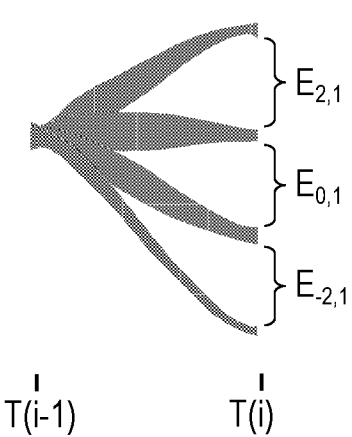
Figure 4E:
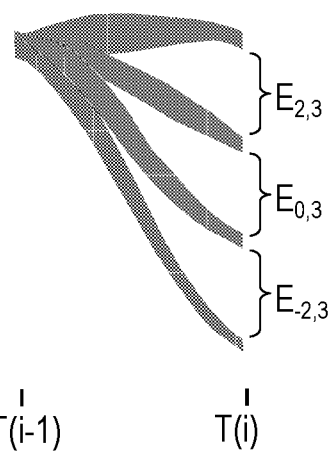

FIG. 4A shows an illustrative eye diagram for a PAM4 signal at the slicer input (the input to the comparators 306A-306L). The diagram represents a superposition of all possible signal combinations (with added noise and intersymbol interference) that may occur in the transition from a previous sampling interval $T_{i-1}$ to a current sampling interval $T_i$. The eye diagram reveals three eyes: a first eye $E_{-2}$ around the −2 decision threshold, a second eye $E_0$ around the 0 decision threshold, and a third eye $E_2$ around the +2 decision threshold. The decision thresholds may be set or adapted to minimize the error rate, typically at a value which coincides with the center of the eye to maximize immunity to additive noise. Larger eyes provide more separation between the typical signal level and the decision threshold, thereby enabling the system to better tolerate noise and thus providing reduced error rates. The eye diagram of FIG. 4A presumes no accounting for prior symbol values, and thus represents the situation for the decision element 204 (FIG. 2A). However, with the unrolling of the feedback filter, the decision elements (e.g., 224A-224D in FIG. 2B) are able to account for prior symbol values. For decision elements 224A-224D, the prior symbol is given as a corresponding one of −3, −1, +1, +3, leading to the eye diagrams shown in FIGS. 4B-4E. The three eyes, when conditioned on 4 possible preceding symbols, become 12 eyes $E_{-2|-3}$, $E_{0|-3}$, $E_{2|-3}$, $E_{-2|-1}$, $E_{0|-1}$, ..., $E_{2|3}$. Typically, the receive signal includes some nonlinearities (and the digitization process and front end filter may introduce further distortions) that cause the 4 eyes for each decision threshold to be slightly offset from each other, with the consequence that the decision threshold for each eye is preferably allowed to vary based on the preceding symbol. This principle can be extended with further unrolling of the feedback filter, though typically with diminishing returns.

Returning to FIG. 3, the dual level finder 320 accepts programmable eye edge selections, so that the controller for the receiver is able to iterate the level finder 320 through the options to measure the size of each eye. The mode selection signal causes the input mux 322 to forward the slicer input signal to the dual level finder (and the demux 324 to forward the finder's adaptively-determined thresholds to registers for storing eye opening information). For the selected eye edges, the level finder operates to find an lower (slicer input has only a given chance of falling below) threshold or an upper (slicer input has only a give chance of falling above) threshold. For example, if no prior symbol decisions are taken into account, there are three eyes. One of those eyes surrounds the +2 decision threshold, and the upper edge of the eye corresponds to the +3 symbol and the lower edge of the eye corresponds to the +1 symbol. The dual level finder can be configured to determine the lower threshold for the slicer inputs corresponding to the +3 symbol and the upper threshold for the slicer inputs corresponding to the +1 symbol. The controller can then set the decision threshold midway between these values to minimize error probability.

If prior symbol decisions are taken into account, the number of eyes increases as discussed previously, but the measurement approach remains substantially the same. As discussed further below, the principle can be extended to measure the influence of any arbitrarily specified previous symbol on a given eye, yielding a measurement of the residual intersymbol interference (ISI) from that previous symbol.

Figure 5:
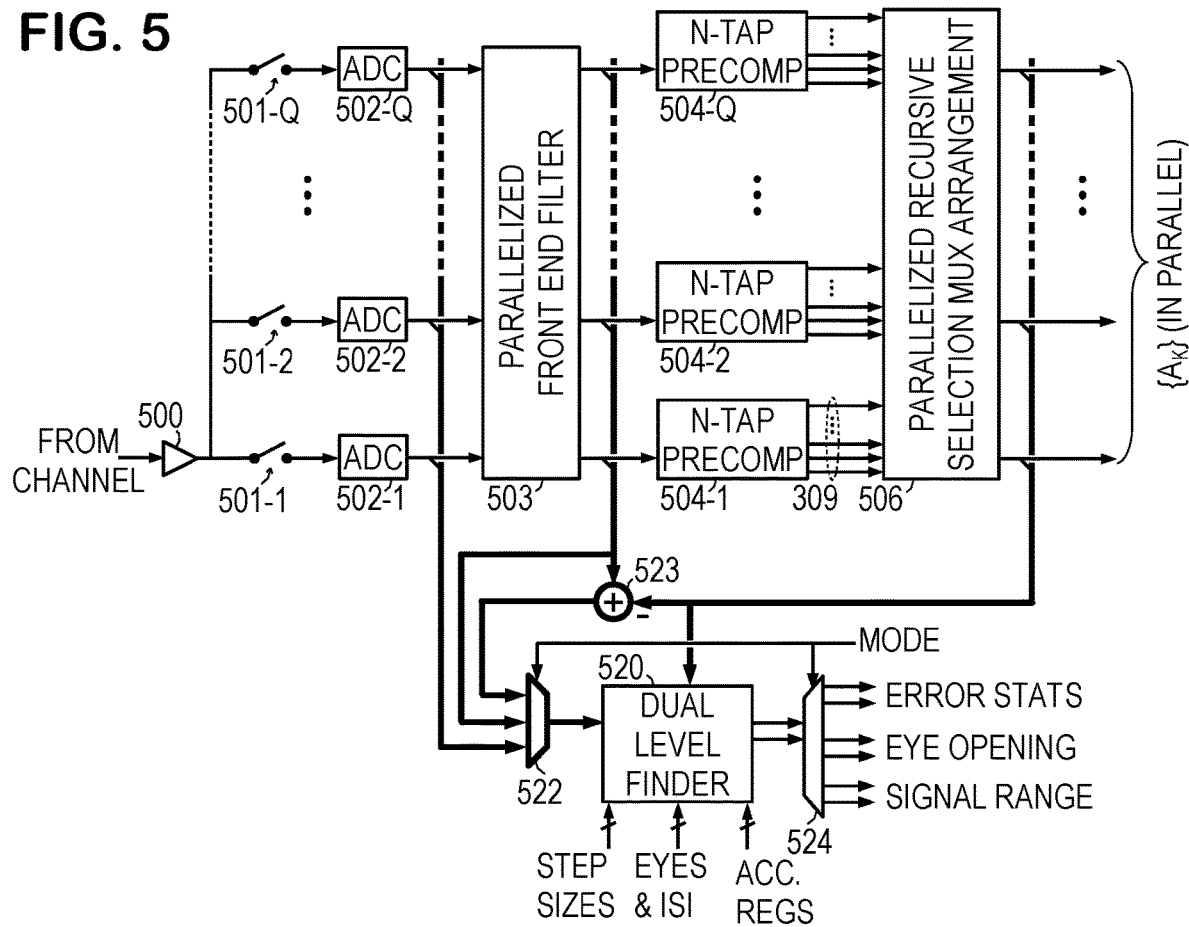
FIG. 5 shows an illustrative parallelized DFE with a multi-function level finder.

In the DFE of FIG. 3, only one symbol decision is output per clock cycle. At particularly high data rates, it may become necessary or desirable to apply parallelization techniques to output multiple symbol decisions per clock cycle as is done in, e.g., U.S. Pat. No. 9,071,479 ("High-speed parallel decision feedback equalizer") and U.S. Pat. No. 9,935,800 ("Reduced complexity precomputation for decision feedback equalizer"), each of which are hereby incorporated herein by reference in their entirety. FIG. 5 shows an illustrative parallel DFE embodiment having a degree of parallelism Q. The analog receive signal is buffered by an adjustable gain amplifier 500. A set of sample-and-hold units 501-1 through 501-Q cyclically capture samples of the buffered analog signal in turn, each providing (in a time-staggered fashion) a stable output for up to Q clock cycles. A set of analog-to-digital converters 502-1 through 502-Q operate on the sample-and-hold outputs to obtain digitized values. A parallelized front end filter 503 combines the digitized values to provide a parallel set of slicer input values (i.e., those values that would have been sequentially produced by front end filter 200). A set of precomputation units 504-1 through 504-Q operate on the parallel set of slicer inputs to produce, in parallel, Q sets of tentative decisions 309. A parallelized recursive selection multiplexer arrangement 506, such as that disclosed in U.S. Pat. No. 9,071,479 ("High-speed parallel decision feedback equalizer"), operates on the Q sets of tentative decisions 309 to produce a parallel set of Q output symbol decisions.

In this example, the dual level finder 520 operates on selected digital signals, and moreover, has been parallelized to operate on parallel sets of the selected digital signals. Summer 523 represents a parallel set of summers that each subtract an output symbol decision from each corresponding slicer input to provide a parallel set of error signals. The mode signal causes a parallel set of input muxes 522 to forward a parallel set of Q receive signals, a parallel set of Q slicer input signals, or a parallel set of Q error signals. As explained further below, the dual level finder 520 operates on the parallel set of selected signals to perform the same measurements as described previously.

Figure 6:
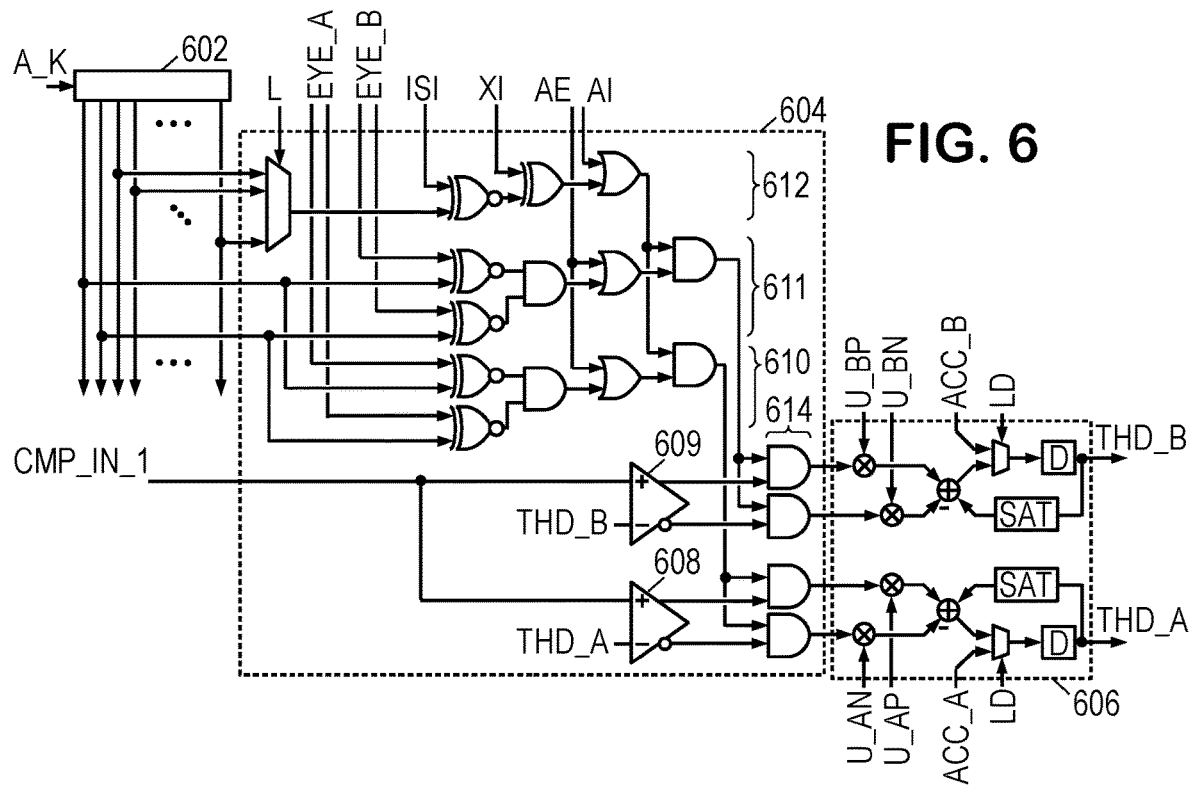
FIG. 6 is a logic diagram for an illustrative dual level finder.

FIG. 6 shows an illustrative dual level finder embodiment suitable for use with non-parallelized equalizer embodiments such as the DFEs of FIG. 2A, 2B, or 3. The illustrative dual level finder includes a shift register 602, a gated dual comparator 604, and an asymmetric dual accumulator 606. The shift register 602 stores past symbol decisions for use by the gated dual comparator 604.

The gated dual comparator 604 includes a first comparator 608 that compares the selected input signal $CMP_{IN1}$ to a first threshold $THD_A$ and a second comparator 609 that compares the selected input signal $CMP_{IN1}$ to a second threshold $THD_B$. The comparators each produce an output signal that is asserted only when the input is greater than or equal to the threshold, and complementary output signal that is asserted only when the input is less than the threshold. These outputs are gated with some pattern-matching logic, which includes a first eye-edge matching logic 610, a second eye-edge matching logic 611, and an ISI matching logic 612. The gating is performed by gating logic 614.

Eye-edge matching logic 610 accepts a current and a prior symbol decision from the shift register and compares them to a first eye-edge selection pattern $EYE_A$. (While the symbols are treated in the figure as binary values, in the present example they are actually representations of PAM4 symbols.) An AND gate output is asserted if the current and prior symbol decisions together match the selection pattern $EYE_A$. An OR gate receives the AND gate output and an AE ("all eyes") control signal, providing an asserted output if either the AND gate output or the AE signal is asserted. (Thus, when the AE signal is asserted, the eye-edge pattern matching criterion is bypassed.) Eye-edge matching logic 611 operates similarly using a second eye-edge selection pattern $EYE_B$.

ISI matching logic includes a multiplexer that, based on a selection input L, forwards a symbol decision that precedes the current symbol decision by L symbol intervals. (In some embodiments, L is permitted to be negative, enabling effects of later symbol decisions to be measured on the "current" signals. Delay elements are employed on the selected input signal to ensure the later symbol decisions are available in the shift register.) The selected preceding symbol decision is compared to a given selection value ("ISI"). (Again, though the figure shows the symbol decision as a binary logic value, the present example would employ a digital representation of a PAM4 signal.) A NOT-XOR gate asserts its output if the selected preceding symbol matches the ISI value. An XOR gate is provided to invert the output of the NOT-XOR gate when an XI (invert ISI) control signal is asserted. An OR gate asserts its output when either the XOR gate output or an AI ("all ISI") control signal is asserted. (Thus when the AI control signal is asserted, the ISI matching criterion is bypassed.) The output of the ISI matching logic 612 is provided to AND gates in the first and second eye-edge matching logic 610, 611, enabling those outputs to be conditioned on whether or not the specified ISI matching condition is satisfied (or bypassed). These AND gates could alternatively be viewed as enabling the output of the ISI matching circuit to be conditioned on whether or not the specified eye-edge matching conditions are satisfied (or bypassed). The outputs of logic 610, 611 may be referred to herein as "pattern-match signals".

Gating logic 614 includes a set of AND gates operating on the comparator outputs. If the first specified eye-edge and/or ISI pattern is matched, the AND gates will pass the output signals from the first comparator 608. These gated outputs are designated as AP and AN. If the second specified eye-edge and/or ISI pattern is matched, the AND gates will pass the output signals from the second comparator 609. These gated outputs are designated as BP and BN.

The asymmetric dual accumulator 606 generates the first threshold $THD_A$ for the first comparators 608 in response to the gated output signals AP, AN, and generates the second threshold $THD_B$ for the second comparator 609 in response to the gated output signals BP, BN. We begin with a discussion of the components generating the first threshold value $THD_A$.

On each clock cycle, a multiplexer responds to an accumulator load signal LD to provide the accumulator register D with either an initial value $ACC_A$ (when LD is asserted) or with the output of a summer. The summer accepts a feedback value from the accumulator register, adds a scaled version of AP, and subtracts a scaled version of AN. A saturation latch SAT detects if the accumulator register reaches a maximum or minimum value and, if so, the latch thereafter continues to provide that value to the summer in place of the actual content of the accumulator register. The latch isn't reset until the accumulator is re-initialized (when LD is asserted).

The scale factors for AP and AN are, in general, different ("asymmetric"), so that when $THD_A$ is exceeded (subject to the specified pattern matching condition), the accumulator register value increments by a step size $\mu_{AP}$, and when the input signal falls below $THD_A$ (subject to the specified pattern matching condition), the accumulator register value decrements by a step size µAN. Since the accumulator register value determines the threshold $THD_A$ via a feedback path, the threshold value stochastically converges to a value where the probability that the signal exceeds it is $\mu_{AN}/(\mu_{AP}+\mu_{AN})$, and the probability that the signal falls below the threshold is $\mu_{AP}/(\mu_{AP}+\mu_{AN})$. Under a similar analysis, $THD_B$ stochastically converges to a value where the probability that the signal exceeds it is $\mu_{BN}/(\mu_{BP}+\mu_{BN})$.

If the step sizes are chosen to be, e.g., $\mu_{AP}=2^{-30}$ and $\mu_{AN}=2^{-20}$, the threshold will converge to a level at which the probability the signal falls below the level is about $2^{-10}$, or 0.098%, thus serving as an good indicator of the bottom of the signal range. A potential advantage of using powers-of-two as the selected step size is that the multipliers can be implemented as simple left or right shifts of the bits in a binary representation. If, as another example, it is desired to find the level at which the probability of exceeding the level is about $10^{-6}$, the step sizes could be set as $\mu_{AP}=2^{-12}$ and $\mu_{AN}=2^{-32}$. In one contemplated embodiment of the dual level finder, the step sizes are selected from a set of predetermined values: $2^{-32}, 2^{-30}, 2^{-28}, 2^{-26}, \ldots, 2^{-10}$.

While the primary characteristic of interest for the step sizes is their ratio, smaller step sizes may be preferred to reduce the stochastic variance of the threshold. On the other hand, smaller step sizes also lengthen the convergence time, so larger step sizes may be desired (at least initially) to speed the convergence if the communication baud rate is slow enough to make convergence time an issue of concern.

Once a threshold level has been determined, whether by adaptation or calculation, the dual level finder can be used to more accurately measure the signal probabilities relative to that threshold. To do this, both thresholds $THD_A$ and $THD_B$ are set to the desired threshold level, with adaptation disabled (e.g., by latching the threshold inputs to the comparators). The ISI and eye-edge patterns for both comparators are set to be the same. The accumulator registers are initialized identically (e.g., at zero), and the step sizes are, e.g., $\mu_{AP}=2^{-32}$, $\mu_{AN}=0$, $\mu_{BP}=0$, and $\mu_{BN}=2^{-32}$, so that one accumulator register ($ACC_A$) tracks the number of times the threshold has been exceeded, and the other accumulator register ($ACC_B$) tracks the number of time the signal falls below the threshold. Then the probabilities of exceeding or falling below the threshold are $ACC_A/(ACC_A+ACC_B)$ and $ACC_B/(ACC_A+ACC_B)$, respectively. Accuracy can be increased with longer accumulation times, subject to the saturation limits of the accumulation registers.

The dual level finder can accordingly determine the upper and lower limits for the range of the selected signal, conditioning the measurements (if desired) with specified conditions on the current symbol decision, the prior symbol decision, and/or a selected ISI symbol which may precede or follow the current symbol interval by a selected amount. When the selected signal is the receive signal, the dual level finder measurements may be useful for measuring the dynamic range of the signal and responsively adapting the gain control. These measurements may also be useful for channel characterization, particularly when symbol decision conditioning is employed (e.g., to estimate channel loss for high and low frequency signal patterns).

When the selected signal is the slicer input signal, the dual level finder measurements may be useful for measuring eye contours and responsively adapting threshold levels. The measurements may also be useful for characterizing residual ISI, which potentially enables improved channel characterization. When equalizers are provided with floating taps, the residual ISI measurements are useful for allocating the floating taps. When the selected signal is the error signal, the dual level finder measurements may be useful for bit or symbol error rate estimation or more general characterization of system and receiver performance.

Figure 7:
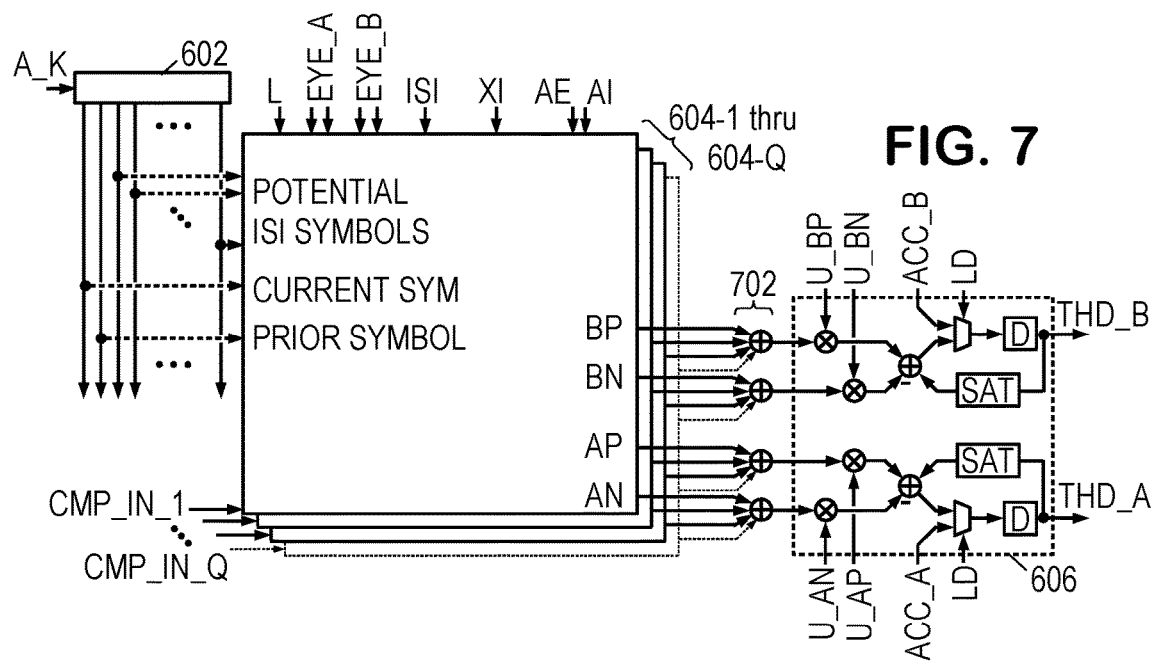
FIG. 7 is a logic diagram for an illustrative dual level finder in a parallelized equalizer.

FIG. 7 shows a parallelized version of the dual level finder which is suitable for use in the parallel DFE embodiment of FIG. 5. The parallelized version operates in much the same way as the embodiment of FIG. 6, but employs multiple gated dual comparators 604-1 through 604-0, each operating on a respective signal from the selected set of parallel input signals $CMP_{IN1}$ through $CMP_{INQ}$. The various comparators 604-1 through 604-Q are also offset in terms of what they consider the "current" symbol decision when coupling to the shift register 602. Otherwise, the various inputs ($THD_A$, $THD_B$, L, $EYE_A$, $EYE_B$, ISI, XI, AE, AI) are the same for each gated dual comparator.

A set of summers 702 sums the gated outputs of the gated dual comparators to provide the asymmetric dual accumulator 606 with combined gated outputs SAP, IAN, EBP, EBN. The asymmetric dual accumulator operates on the combined gated outputs as described previously.

Numerous alternative forms, equivalents, and modifications will become apparent to those skilled in the art once the above disclosure is fully appreciated. For example, DFEs were used to provide context for the disclosed level finders, but the level finders are equally applicable to other types of equalizers including linear equalizers, partial response equalizers, and peak detectors. The disclosed level finders are dual level finders, but one of ordinary skill in the art will recognize single level and other multi-level finder embodiments are readily derived from the example embodiments disclosed herein. The pattern matching employed by the disclosed level finder is readily modified to provide longer or shorter patterns and different pattern matching criteria. It is intended that the claims be interpreted to embrace all such alternative forms, equivalents, and modifications that are encompassed in the scope of the appended claims.

What is claimed is:

1. A receiver that comprises:
a decision element that derives symbol decisions from a slicer input signal;
an equalizer that converts a receive signal into the slicer input signal;
a summer that combines the symbol decisions with the slicer input signal to produce an error signal; and
a level finder that operates on at least one signal, said at least one signal being any of said receive signal, said slicer input signal, and said error signal, to determine a threshold at which said at least one signal has a given probability of exceeding the threshold.

2. The receiver of claim 1, wherein each of the decision element, the equalizer, the summer, and a gated comparator component of the level finder, are parallelized to provide concurrent processing paths.

3. The receiver of claim 1, wherein the probability is subject to a programmable condition being met.

4. The receiver of claim 3, wherein the programmable condition includes one or more conditions in the list consisting of:

a symbol decision having a given value at a selected offset from a current symbol interval,
a symbol decision not having the given value at the selected offset from the current symbol interval,
a current symbol having a first specified value,
a preceding symbol having a second specified value, and
assertion of one or more matching criterion bypass signals.

5. The receiver of claim 1, wherein the level finder is a dual level finder.

6. The receiver of claim 1, wherein the level finder operates on the receive signal to determine upper and lower limits for a range of the receive signal.

7. The receiver of claim 6, wherein the receiver further comprises control circuitry that uses the upper and lower limits to perform adaptive gain control.

8. The receiver of claim 1, wherein the level finder operates on the slicer input signal to determine upper and lower eye edges.

9. The receiver of claim 8, wherein the receiver further comprises control circuitry that uses said upper and lower eye edges to set a decision threshold for at least one eye.

10. The receiver of claim 8, wherein the receiver further comprises control circuitry that detects residual intersymbol interference (ISI) based on the upper and/or lower eye edges and uses the residual ISI to allocate one or more floating taps of the equalizer.

11. The receiver of claim 1, wherein the level finder operates on the error signal to estimate a bit or symbol error rate.

12. A receiver that comprises:
an equalizer that converts a receive signal into a slicer input signal;
a decision element that derives symbol decisions from the slicer input signal; and
a level finder that operates on the slicer input signal to determine an upper threshold at which the slicer input signal has a given probability of exceeding the upper threshold for symbol decisions corresponding to a lower edge of an eye.

13. The receiver of claim 12, wherein the level finder further determines a lower threshold at which the slicer input signal has the given probability of falling below the lower threshold for symbol decisions corresponding to an upper edge of the eye.

14. The receiver of claim 13, wherein the eye is one of multiple eyes, and wherein the level finder determines upper and lower threshold for each of the multiple eyes.

15. The receiver of claim 14, further comprising a controller that adjusts a decision threshold for each of the multiple eyes to be midway between the corresponding upper and lower thresholds.

16. A method that comprises:
equalizing a receive signal to produce a slicer input signal;
operating on the receive signal with a level finder to determine an upper limit at which the receive signal has a given probability of exceeding the upper limit and a lower limit at which the receive signal has the given probability of falling below the lower limit;
deriving symbol decisions from the slicer input signal; and
operating on the slicer input signal with the level finder to determine an upper threshold at which the slicer input signal has a given probability of exceeding the upper threshold for symbol decisions corresponding to a lower edge of an eye, and to determine a lower threshold at which the slicer input signal has the given probability of falling below the lower threshold for symbol decisions corresponding to an upper edge of the eye.

17. The method of claim 16, further comprising: using the upper and lower limits to adjust a gain control amplifier for the receive signal.

18. The method of claim 16, further comprising: using the upper and lower thresholds to adjust a decision threshold for the eye.

19. A method that comprises:
- equalizing a receive signal to produce a slicer input signal;
- operating on the receive signal with a level finder to determine an upper limit at which the receive signal has a given probability of exceeding the upper limit and a lower limit at which the receive signal has the given probability of falling below the lower limit;
- deriving symbol decisions from the slicer input signal;
- combining the symbol decisions with the slicer input signal to produce an error signal; and
- operating on the error signal with the level finder to determine an upper threshold at which the error signal has a predetermined probability of exceeding the upper threshold and a lower threshold at which the error signal has the predetermined probability of falling below the lower threshold.

20. The method of claim 19, further comprising estimating a bit or symbol error rate based at least in part on the upper and lower thresholds.

* * * * *